United States Patent
Xu et al.

(10) Patent No.: US 9,490,279 B2
(45) Date of Patent: Nov. 8, 2016

(54) SENSOR INCLUDING TFT DEVICE AND PHOTODIODE SENSING DEVICE AND METHOD FOR FABRICATING THE SAME

(71) Applicant: BEIJING BOE OPTOELECTRONICS TECHNOLOGY CO., LTD., Beijing (CN)

(72) Inventors: Shaoying Xu, Beijing (CN); Zhenyu Xie, Beijing (CN); Xu Chen, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/128,748

(22) PCT Filed: Nov. 21, 2012

(86) PCT No.: PCT/CN2012/084972
§ 371 (c)(1),
(2) Date: Dec. 23, 2013

(87) PCT Pub. No.: WO2014/015588
PCT Pub. Date: Jan. 30, 2014

(65) Prior Publication Data
US 2015/0041870 A1 Feb. 12, 2015

(30) Foreign Application Priority Data
Jul. 26, 2012 (CN) .......................... 2012 1 0262819

(51) Int. Cl.
*H01L 27/144* (2006.01)
*H01L 27/146* (2006.01)
(Continued)

(52) U.S. Cl.
CPC ..... *H01L 27/1443* (2013.01); *H01L 27/14609* (2013.01); *H01L 27/14618* (2013.01);
(Continued)

(58) Field of Classification Search
CPC .................................................. H01L 27/14609
See application file for complete search history.

(56) References Cited

U.S. PATENT DOCUMENTS

| | | | |
|---|---|---|---|
| 2009/0289910 A1* | 11/2009 | Hattori | 345/173 |
| 2010/0237250 A1* | 9/2010 | Hayashi | 250/361 R |
| 2011/0193076 A1* | 8/2011 | Yun | H01L 27/1214 257/43 |

FOREIGN PATENT DOCUMENTS

| | | |
|---|---|---|
| CN | 102544024 A | 7/2012 |
| CN | 102629610 A | 8/2012 |

OTHER PUBLICATIONS

Written Opinion of the International Searching Authority dated Apr. 26, 2013; PCT/CN2012/084972.
(Continued)

*Primary Examiner* — Robert Huber
*Assistant Examiner* — Xia L Cross
(74) *Attorney, Agent, or Firm* — Ladas & Parry LLP

(57) ABSTRACT

A sensor and its fabrication method are provided, the sensor includes: a base substrate, a group of gate lines and a group of data lines arranged as crossing each other, and a plurality of sensing elements arranged in an array and defined by the group of gate lines and the group of data lines, each sensing element comprising a TFT device and a photodiode sensing device, wherein: the TFT device is a top gate TFT; the photodiode sensing device includes: a bias electrode and a bias electrode pin connected with the bias electrode, both of which are disposed on the base substrate; a photodiode disposed on the bias electrode and a transparent electrode disposed on the photodiode and connected with the source electrode.

20 Claims, 11 Drawing Sheets

(51) Int. Cl.
*H01L 31/105* (2006.01)
*H01L 29/66* (2006.01)
*H01L 29/786* (2006.01)
*H01L 31/18* (2006.01)

(52) U.S. Cl.
CPC ... *H01L27/14676* (2013.01); *H01L 27/14692* (2013.01); *H01L 29/66742* (2013.01); *H01L 29/786* (2013.01); *H01L 31/105* (2013.01); *H01L 31/18* (2013.01); *H01L 2924/0002* (2013.01)

(56) References Cited

OTHER PUBLICATIONS

International Search Report Issued Apr. 24, 2013 Appln. No. PCT/CN2012/084972.

International Preliminary Report on Patentability Appln. No. PCT/CN2012/084972; Dated Jan. 27, 2015.

\* cited by examiner

SENSOR INCLUDING TFT DEVICE AND PHOTODIODE SENSING DEVICE AND METHOD FOR FABRICATING THE SAME

FIELD OF THE ART

Embodiments of the invention relate to a sensor and a method for fabricating the same.

BACKGROUND

For healthy reasons, various non-invasive medical diagnosis methods are becoming widely accepted by people. Among the various non-invasive medical diagnosis methods, Computed Tomography (CT) is already generally used. An indispensable component used in CT equipments is sensor.

FIG. 1 illustrates a basic configuration of a sensor. The sensor 12 comprises a plurality of scan lines 15, a plurality of data lines 16 and a plurality of sensing elements, each of the sensing elements comprises a photodiode 13 and a field effect transistor (FET) 14. The gate of the FET 14 is connected with a corresponding scan line 15 of the sensor 12, the drain of the FET 14 is connected with a corresponding data line 16 of the sensor, and the source of the FET 14 is connected with the photodiode 13. One end of the date lines 16 is connected to a data readout circuit 18 via a connecting pin 17.

The working principle of the above sensor is as follows: the sensor 12 supplies a scan drive signal via the scan lines 15 to control the ON/OFF state of the FET 14 of each sensing element. When the FET 14 is turned on, the photocurrent signal generated by the photodiode 13 is output sequentially via the data line 16 connected with the FET 14 and the data readout circuit 18, and capturing of the photocurrent signal is realized by controlling signal timing on the scan line 15 and the data line 16. That is to say, the capturing of the photocurrent signal is controlled by controlling the ON/OFF state of the FET 14.

Currently, sensors generally employ a thin film transistor (TFT) plate configuration. Such a sensor may have many layers in its cross section, for example, each sensing element comprises a substrate, a gate electrode layer, a gate insulating layer, an active layer, a source electrode and a drain electrode layer, a passivation layer, PIN junction of the PIN photosensor and transparent electrode window layer, and a bias line layer as well as a light-shield strip layer. Detailed patterning layers may differ from each other for different sensors, depending on the specific configuration of the sensors.

Individual patterning layers of the sensor are generally formed via patterning processes and each patterning process generally comprises steps of masking, developing, exposure, etching and peeling. That is to say, multiple patterning processes are needed to realize multiple patterning layers of the sensor. For example, 9 to 11 patterning processes are needed to form a multi-layer sensor as described above, thereby 9 to 11 masks are required, which makes the fabrication cost high and the process complicated and the production capacity difficult to increase.

SUMMARY

The invention aims to provide a sensor and its fabrication method so as to overcome the technical problems of sensors having high production cost and complicated fabrication processes and difficulty in improving the production capacity.

A first aspect of the invention provides a sensor, comprising: a base substrate, a group of gate lines and a group of data lines arranged as crossing each other, and a plurality of sensing elements arranged in an array and defined by the group of gate lines and the group of data lines, each sensing element comprising a TFT device and a photodiode sensing device, wherein:

the TFT device comprises: a source electrode and a drain electrode arranged opposed to each other to form a channel, wherein the drain electrode is connected with a neighboring data line; an ohmic layer disposed on the source electrode and the drain electrode; an active layer disposed on the ohmic layer and overlaying the channel; a gate insulating layer disposed on the active layer; and a gate electrode disposed on the gate insulating layer and over the channel and connected with a neighboring gate line;

the photodiode sensing device comprises: a bias electrode and a bias electrode pin disposed on the base substrate, the bias electrode pin is connected with the bias electrode; a photodiode disposed on the bias electrode and a transparent electrode disposed on the photodiode and connected with the source electrode.

A second aspect of the invention provides a method for fabricating a sensor comprising:

forming, on a base substrate, a pattern of a bias electrode, a pattern of a bias electrode pin connected with the bias electrode, a pattern of a photodiode disposed on the bias electrode and a pattern of a transparent electrode disposed on the photodiode;

forming a pattern of a source electrode, a drain electrode and a data line, as well as a pattern of an ohmic layer on the source electrode and the drain electrode, by using a patterning process, wherein the source electrode and the drain electrode are disposed opposed to each other to form a channel, the drain electrode is connected with the data line and the source electrode is connected with the transparent electrode;

forming a pattern of an active layer which is disposed on the ohmic layer and overlays the channel by using a patterning process; and forming a gate insulating layer overlaying the base substrate, and forming a pattern of a gate electrode which is disposed on the gate insulating layer and over the channel, and a pattern of a gate line connected with the gate electrode by using a patterning process.

The TFT sensing device of the sensor in accordance with the embodiment of the invention is a top gate TFT and the sensor is fabricated through six or sever patterning processes, which reduces the number of mask used in the fabrication and the production cost, in comparison with conventional production processes, and improves the production capacity and defect-free rate of the products.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

NUMERAL REFERENCES

Figure 1:
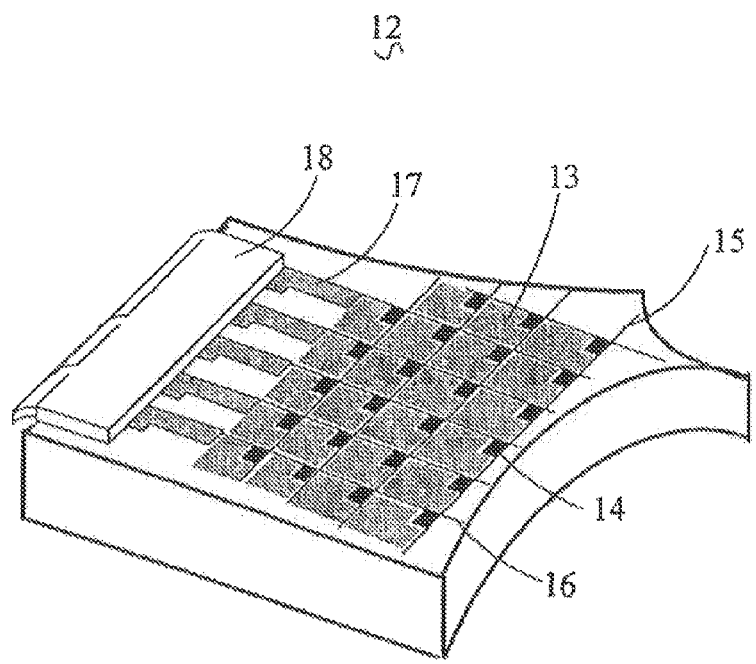
FIG. 1 schematically illustrates a three-dimensional (3-D) configuration of a conventional sensor.

12: sensor; 13: photodiode; 14: field effect transistor (FET)
15: scan line 16: data line 17: connecting pin
18: data readout circuit 30: gate line 31: data line
32: base substrate 33: source electrode 34: drain electrode
35: ohmic layer 36: active layer 37: gate insulating layer
38: gate electrode 57: second passivation layer 40: photodiode
41: transparent electrode 42a: bias electrode 40a: N-type semiconductor
40b: I-type semiconductor 40c: P-type semiconductor 43: first passivation layer
42b: bias electrode pin

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the embodiments of the invention described below, a sensor may be an X-ray sensor or other type of sensors, such as a sensor transmitting signals via photo-electric conversion. The following descriptions and drawings are directed to a single sensing element, though other sensing elements may be formed in the same way.

Embodiments of the invention provide a sensor and its fabrication method to address the technical problems of sensors having high fabrication cost and complicated fabrication processes in the conventional art.

Figure 2:
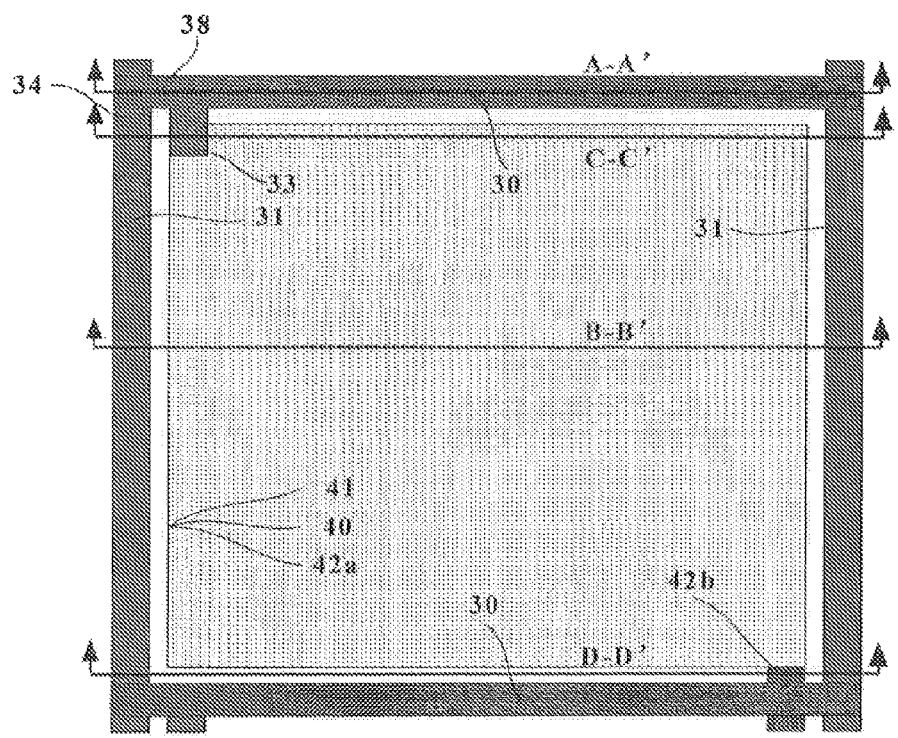
FIG. 2 is a top view of a sensing element of a sensor in accordance with an embodiment of the invention.
Figure 15:
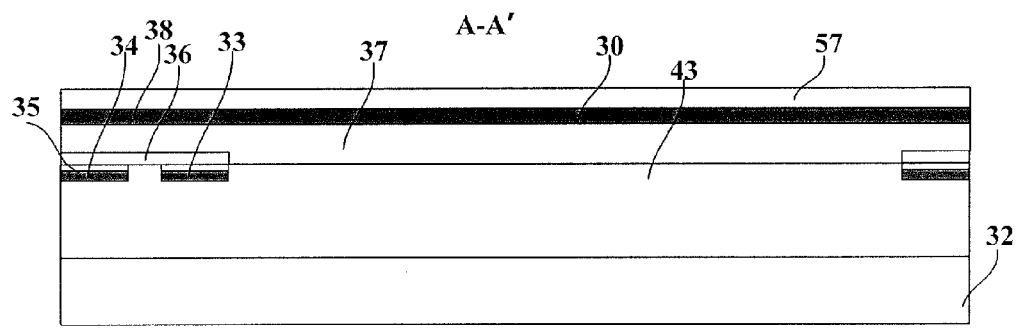
FIG. 15 is a cross section view taken along the line A-A' of FIG. 2 after the seventh patterning process for the sensing element in accordance with an embodiment of the invention.
Figure 16:
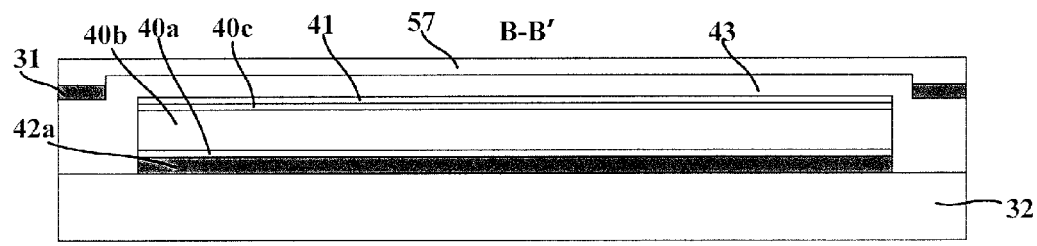
FIG. 16 is a cross section view taken along the line B-B' of FIG. 2 after the seventh patterning process for the sensing element in accordance with an embodiment of the invention.

FIG. 2 illustrates a top view of a sensing element of a sensor in accordance with an embodiment of the invention. FIGS. 15 and 16 are cross section views of the sensing element taken along the lines A-A' and B-B' of FIG. 2, respectively. As illustrated in FIGS. 2, 15 and 16, the sensor comprises: a base substrate 32, a group of gate lines 30 and a group of data lines arranged as crossing each other, and a plurality of sensing elements arranged in an array and defined by the group of gate lines 30 and the group of data lines 31. Each sensing element comprises a TFT device and a photodiode sensing device, in which:

The TFT device comprises: a source electrode 33 and a drain electrode 34 arranged opposed to each other to form a channel, where the drain electrode 34 is connected with a neighboring data line 31; an ohmic layer 35 disposed on the source electrode 33 and the drain electrode 34; an active layer 36 disposed on the ohmic layer 35 and overlaying the channel; a gate insulating layer 37 disposed on the active layer 36; and a gate electrode 38 that is disposed on the gate insulating layer 37 and over the channel and connected with a neighboring gate line 30.

The photodiode sensor device comprises: a bias electrode 42a and a bias electrode pin 42b disposed on the base substrate 32, the bias electrode pin 42b is connected with the bias electrode 42a; a photodiode 40 disposed on the bias electrode 42a; and a transparent electrode 41 disposed on the photodiode 40 and connected with the source electrode 33.

In an embodiment of the invention, the base substrate 32 may be a glass substrate, a plastic substrate or a substrate made of other materials; the gate line 30, the gate electrode 38, the date line 31, the source electrode 33, the drain electrode 34, the bias electrode 42a and the bias electrode pin 42b may be of the same material such as a single layer film made of aluminum neodymium (AlNd) alloy, aluminum (Al), copper (Cu), molybdenum (Mo), molybdenum tungsten (MoW) alloy or chromium (Cr), or a multi-layer film made of any combination of these metal elements or alloy materials. The single layer or multi-layer film may have a thickness of for example 150 nm to 450 nm.

In an embodiment of the invention, a material of the ohmic layer 35 may be for example a doped semiconductor (n+a-Si); a material of the active layer 36 may be a semiconducting material, such as, amorphous silicon (a-Si), with a thickness of 30 nm to 250 nm; a material of the gate insulating layer 37 may be silicon nitrides with a thickness of 300 nm to 500 nm; a material of the transparent electrode 41 may be transparent conductive materials such as indium tin oxides (ITO) or indium zinc oxides (IZO).

In an embodiment of the invention, the photodiode may be a PIN photodiode, comprising: an N-type semiconductor (n+a-Si) 40a disposed on the bias electrode 42a, a I-type semiconductor (a-Si) 40b disposed on the N-type semiconductor 40a, and a P-type semiconductor (p+a-Si) 40c disposed on the I-type semiconductor. A PIN photodiode has the advantages of having small junction capacitance, short transit time and high sensitivity and is therefore a preferred choice. In other configurations of the invention, the photodiode may be a MIS(Metal-Insulator-Semiconductor)-type photodiode and the like.

Still referring to FIGS. 2, 15 and 16, in an embodiment, the sensor may further comprises:

a first passivation layer 43 disposed on the transparent electrode 41 and the bias electrode pin 42b of each photodiode sensing device and overlaying the base substrate, where the source electrode 33, the drain electrode 34 and the data line 31 are disposed on the first passivation layer 43. The first passivation layer 43 (and a second passivation layer 57 described below) may be made of an inorganic insulating film (such as silicon nitride) or an organic insulating film (such as a photosensitive resin material or a non-photosensitive resin) with a thickness of, for example, 150 nm to 1500 nm.

In an embodiment, the first passivation layer 43 has a groove 710 for accommodating the source electrode 33, the drain electrode 34, the data line 31 and the ohmic layer 35, and a through hole 331 (shown in FIG. 17) for connecting the source electrode 33 with the transparent electrode 41. Furthermore, an upper surface of the first passivation layer may be flat, and the source electrode, the drain electrode, the data line as well as the ohmic layer are formed on the upper surface of the first passivation layer in a protruded way, while the source electrode and the transparent electrode are connected to each other through the through hole 331 on the first passivation layer.

Figure 17:
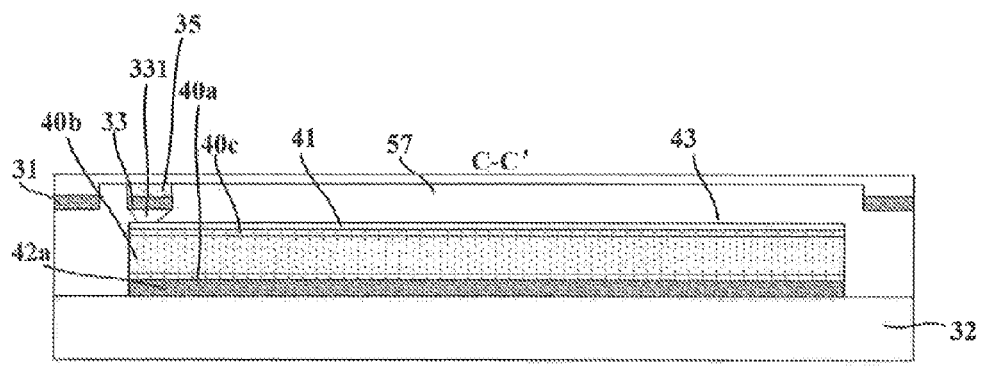
FIG. 17 is a cross-sectional view taken along a line C-C' of FIG. 2 after the seventh patterning process for the sensing element in accordance with an embodiment of the invention.

In an embodiment of the invention, the sensor may further comprises: a second passivation layer disposed on the gate line 30 and gate electrode 38 of each of the TFT devices and overlaying the base substrate. The second passivation layer 57 has a signal-transmitting region via hole (FIGS. 16 and 17 are just cross sections of a sensing element, therefore, the signal-transmitting region via hole located at the peripheral of the base substrate is not shown).

In an embodiment of the invention, the TFT sensing device of the sensor is a top gate TFT and the sensor is fabricated through six or sever patterning processes, which reduces the number of masks used in the fabrication and the production cost, in comparison with conventional production processes, and improves the production capacity and defect-free rate of the products.

Figure 19:
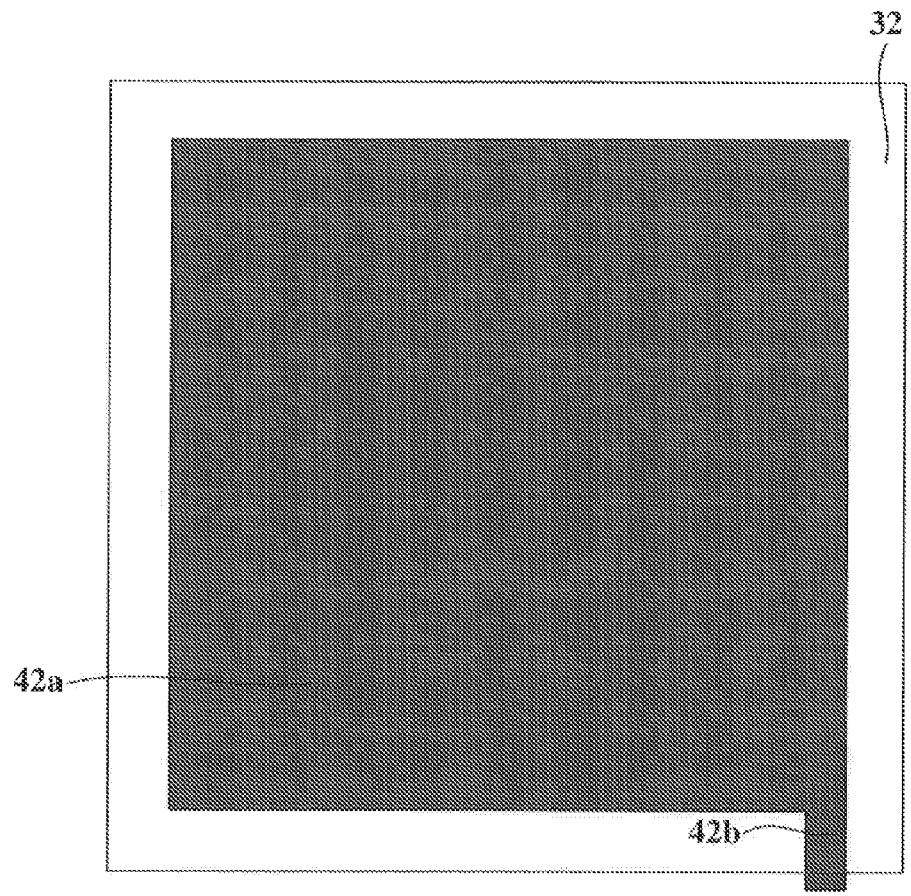
FIG. 19 is a top view after the first patterning process for the sensing element in accordance with an embodiment of the invention.

In accordance with an embodiment of the invention, a method for fabricating the above sensor comprises:

Step 101: a first patterning process is used to form, on the base substrate 32, a pattern of the bias electrode 42a and a pattern of the bias electrode pin 42b. A cross section after the first patterning process is illustrated in FIGS. 3 and 4, as well as in FIG. 19.

Figure 3:
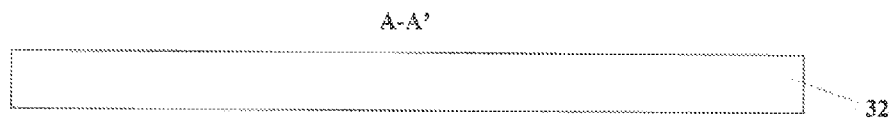
FIG. 3 is a cross section view taken along the line A-A' of FIG. 2 after the first patterning process for the sensing element in accordance with an embodiment of the invention.
Figure 4:
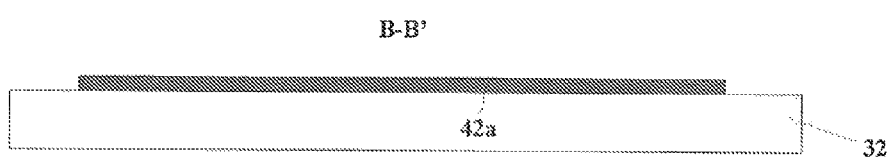
FIG. 4 is a cross section view taken along the line B-B' of FIG. 2 after the first patterning process for the sensing element in accordance with an embodiment of the invention.

FIGS. 3 and 4 illustrate the cross section after the first patterning process. Please note that the base substrate as illustrated in FIGS. 3 and 4 is only a similar cross section taken along the lines A-A' and B-B' of FIG. 2 and does not represent a real cross section of the base substrate of FIG. 2. Similarly, FIGS. 5 to 14 are illustrated in the same way.

A patterning process sequentially comprises steps of substrate cleaning, film forming, photoresist application, exposure, developing, etching, photoresist removal and so on. The base substrate may be cleaned using de-ionized water or an organic cleanser. The film forming process is to form the structural layers to be patterned. For example, a metal layer is generally formed using Physical Vapor Deposition (PVD), such as magnetron sputtering, and then wet etched to form a pattern. While a non-metal layer is usually formed using Chemical Vapor Deposition (CVD) and then dry etched to form a pattern. Patterning processes in the following steps are the same and will not be described.

Figure 5:
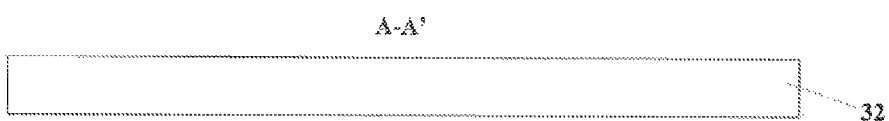
FIG. 5 is a cross section view taken along the line A-A' of FIG. 2 after the second patterning process for the sensing element in accordance with an embodiment of the invention.
Figure 6:
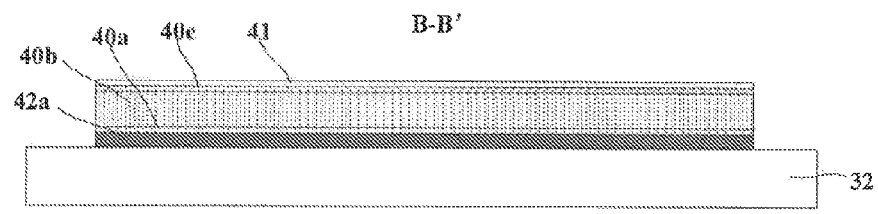
FIG. 6 is a cross section view taken along the line B-B' of FIG. 2 after the second patterning process for the sensing element in accordance with an embodiment of the invention.

Step 102: a patterning process is used to form a pattern of the photodiode 40 on the bias electrode 42 and a pattern of the transparent electrode 41 on the photodiode 40. A cross section after the second patterning process is illustrated in FIGS. 5 and 6.

As an example, when the photodiode 40 is a PIN photodiode, the step 102 may comprises:

An N-type semiconductor layer, an I-type semiconductor layer, a P-type semiconductor layer and a transparent electrode layer are sequentially deposited, and the patterns of the photodiode 40 and the transparent electrode 41 are formed through a single patterning process. In the patterning process, the pattern of the transparent electrode 41 may be formed using wet etching single or may be formed at the same time with the pattern of the photodiode using dry etching.

Figure 7:
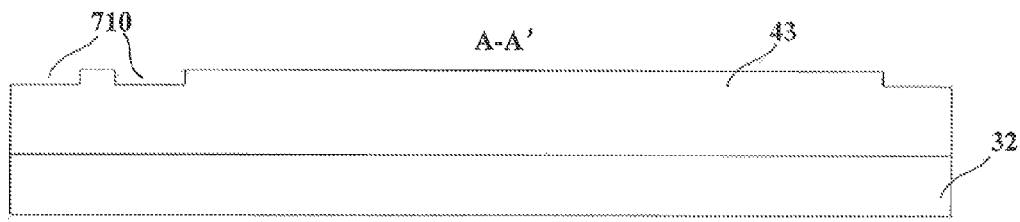
FIG. 7 is a cross section view taken along the line A-A' of FIG. 2 after the third patterning process for the sensing element in accordance with an embodiment of the invention.
Figure 8:
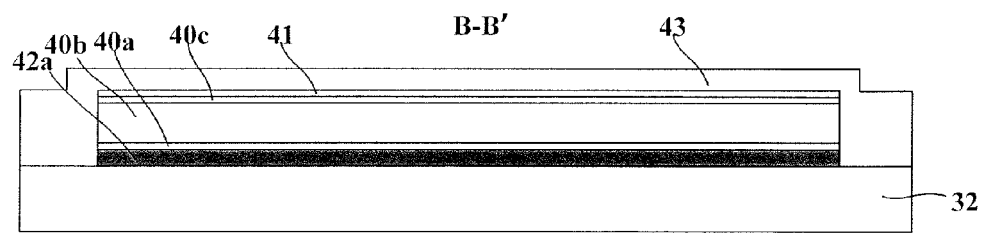
FIG. 8 is a cross section view taken along the line B-B' of FIG. 2 after the third patterning process for the sensing element in accordance with an embodiment of the invention.
Figure 18:
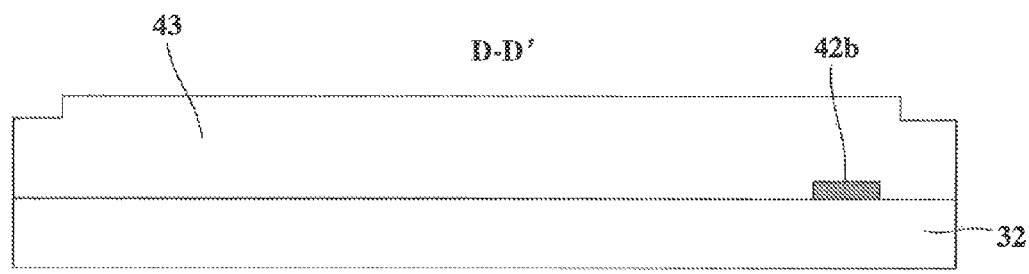
FIG. 18 is a cross-sectional view taken along a line D-D' of FIG. 2 after the third patterning process for the sensing element in accordance with an embodiment of the invention.

Step 103: a patterning process is used to form a pattern of the first passivation layer 43 which is disposed on the transparent electrode 41 and the bias electrode pin 42b and overlays the base substrate. A cross section after the third patterning process is illustrated in FIGS. 7 and 8, as well as in FIG. 18.

Figure 9:
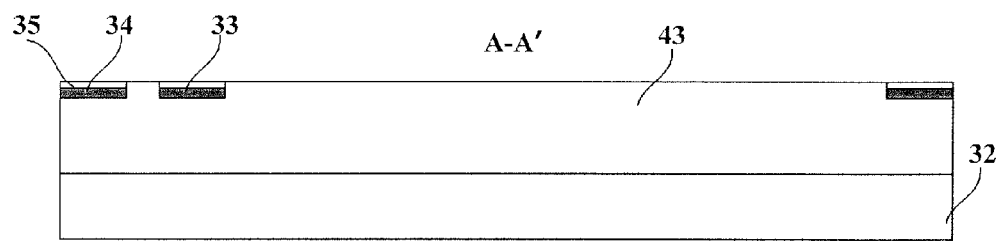
FIG. 9 is a cross section view taken along the line A-A' of FIG. 2 after the fourth patterning process for the sensing element in accordance with an embodiment of the invention.
Figure 10:
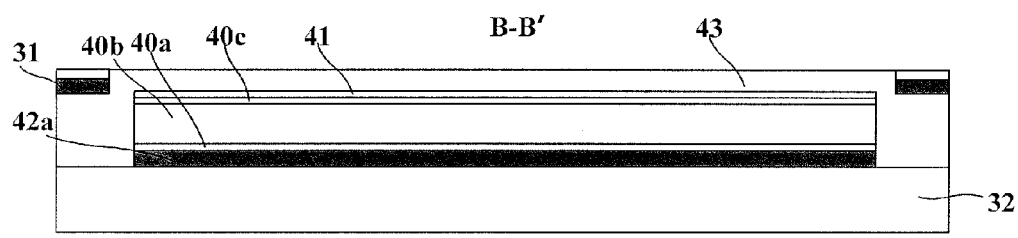
FIG. 10 is a cross section view taken along the line B-B' of FIG. 2 after the fourth patterning process for the sensing element in accordance with an embodiment of the invention.

Step 104: a patterning process is used to form a pattern of the source electrode 33, the drain electrode 34, the data line 31 and form a pattern of the ohmic layer 35 on the source electrode 33 and drain electrode 34, where the source electrode 33 and drain electrode 34 are disposed opposed to each other to form the channel, the drain electrode 34 is connected with the data line 31 and the source electrode 33 is connected with the transparent electrode 41. A cross section after the fourth patterning process is illustrated in FIGS. 9 and 10.

Figure 11:
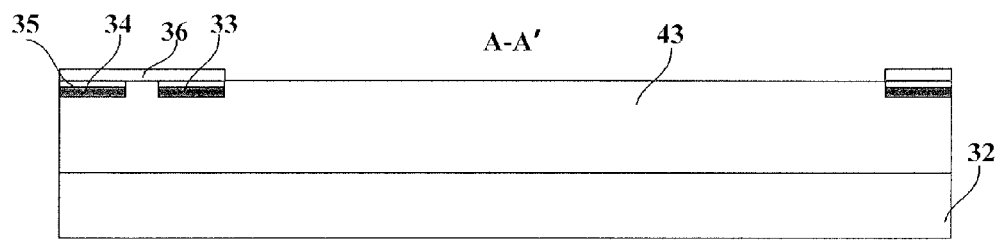
FIG. 11 is a cross section view taken along the line A-A' of FIG. 2 after the fifth patterning process for the sensing element in accordance with an embodiment of the invention.
Figure 12:
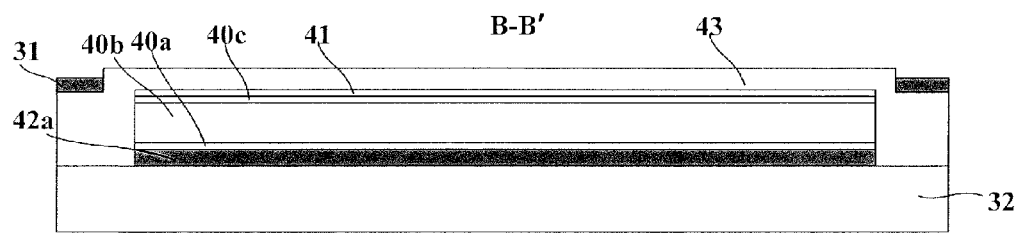
FIG. 12 is a cross section view taken along the line B-B' of FIG. 2 after the fifth patterning process for the sensing element in accordance with an embodiment of the invention.

Step 105: a patterning process is used to form a pattern of the active layer 36 which is disposed on the ohmic layer 35 and overlays the channel. A cross section after the fifth patterning process is illustrated in FIGS. 11 and 12.

Figure 13:
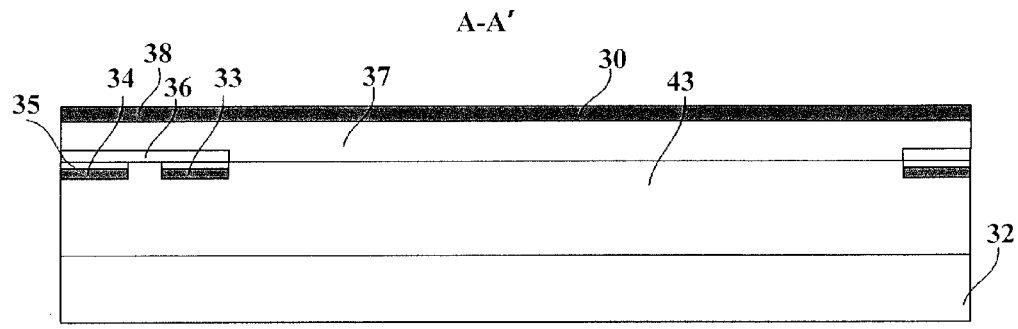
FIG. 13 is a cross section view taken along the line A-A' of FIG. 2 after the sixth patterning process for the sensing element in accordance with an embodiment of the invention.
Figure 14:
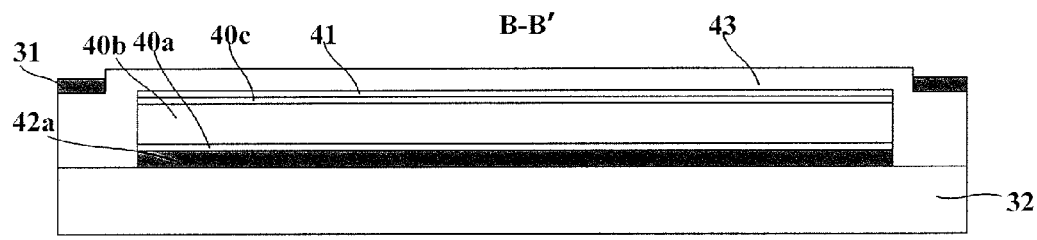
FIG. 14 is a cross section view taken along the line B-B' of FIG. 2 after the sixth patterning process for the sensing element in accordance with an embodiment of the invention.

Step 106: the gate insulating layer 37 overlaying the base substrate is formed and a patterning process is used to form a pattern of the gate electrode 38 which is disposed on the gate insulating layer 37 and over the channel, and a pattern of the gate line 30 connected with the gate electrode 38. A cross section after the sixth patterning process is illustrated in FIGS. 13 and 14.

Step 107: a patterning process is used to Ruin a pattern of the second passivation layer 57 overlaying the base substrate, where the second passivation layer 57 has a signal-transmitting region via hole (located at the peripheral of the base substrate and not shown in the figures). A cross section after the seventh patterning process is illustrated in FIGS. 15 and 16.

Figure 20A:
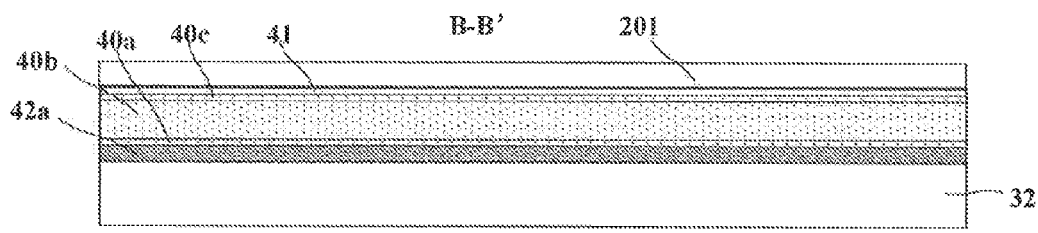
FIG. 20A-20C, 21A-21C, 22A-22C, and 23A-23C are cross-sectional views or top views during a patterning process for the sensing element in accordance with an embodiment of the invention.
Figure 20B:
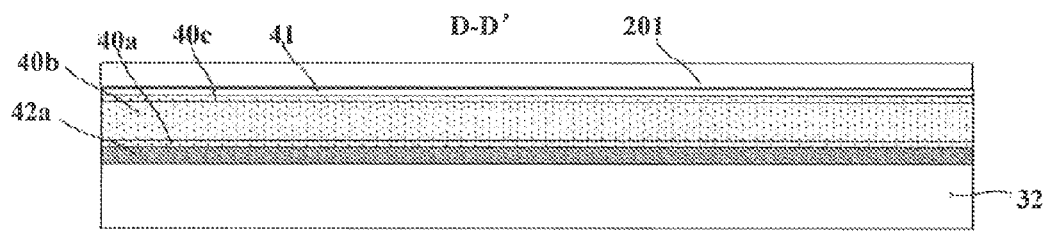
Figure 20C:
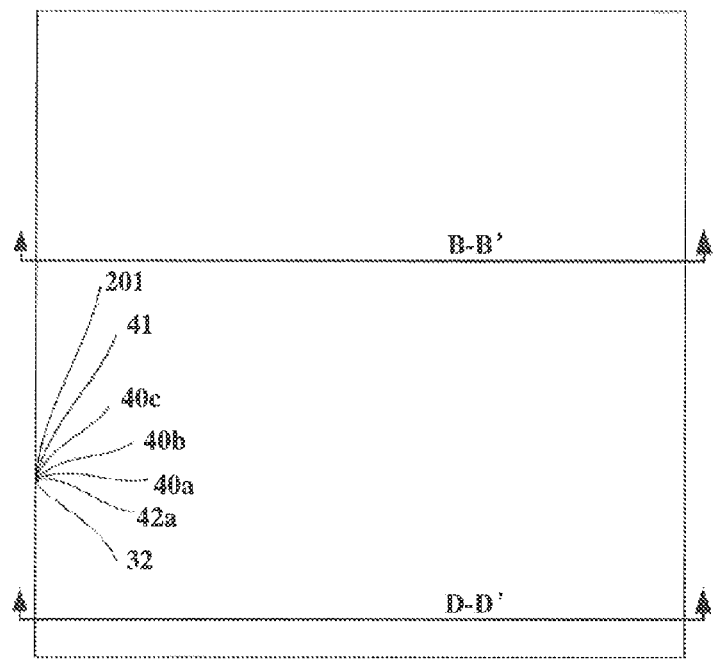

In an embodiment, the above steps 101 and 102 may be combined into a single step, that is, a single patterning process is used to form: a pattern of the bias electrode on the base substrate, a pattern of the bias electrode pin connected with the bias electrode, a pattern of the photodiode disposed on the bias electrode and a pattern of the transparent electrode disposed on the photodiode. The combined step may comprises:

S1: sequentially depositing, on the base substrate 32, the bias electrode metal, 42a, the photodiode material layer 40a-40c and the transparent electrode layer 41, and applying a photoresist 201 on the transparent electrode layer 41 (FIG. 20A illustrates a cross-sectional view taken along a line B-B' of FIG. 20C of the sensing element after step S1; FIG. 20B illustrates a cross-sectional view taken along a line D-D' of FIG. 20C of the sensing elements after step S1; FIG. 20C illustrates a top view of the sensing element after step S1).

Figure 21A:
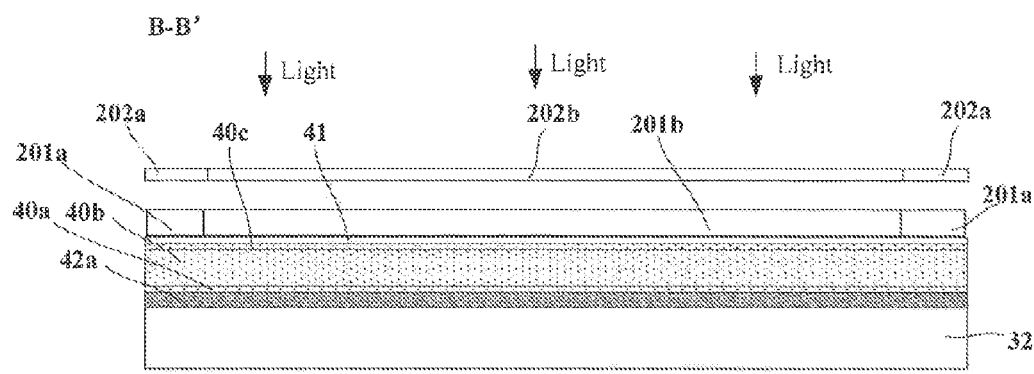
Figure 21B:
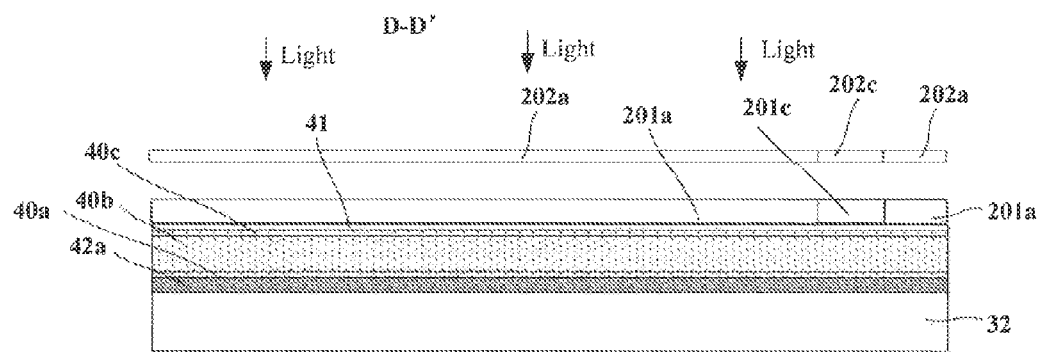
Figure 21C:
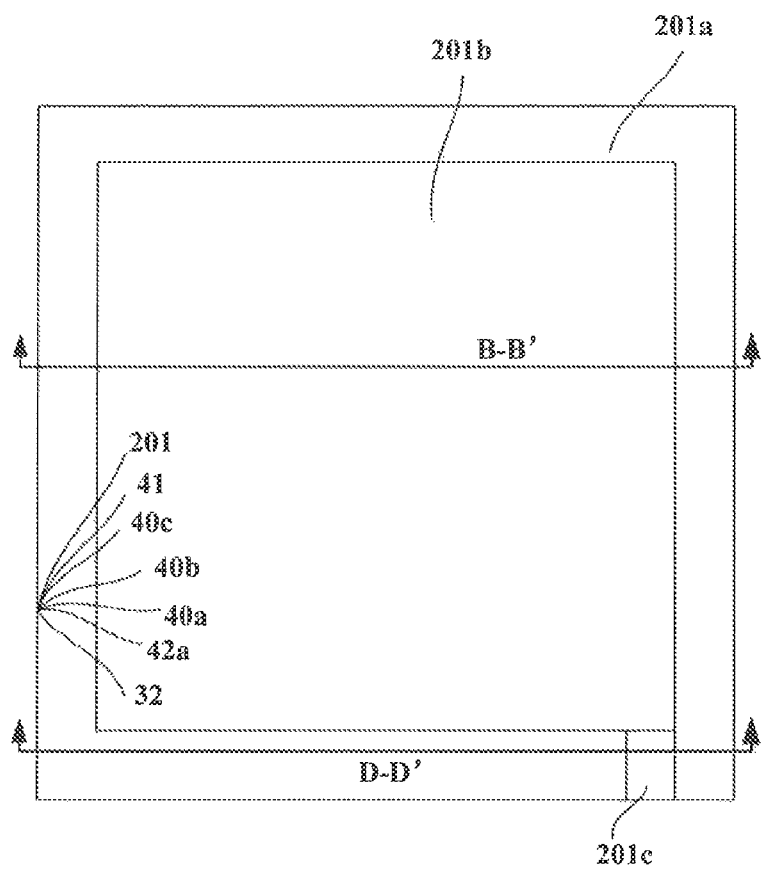

S2: exposing and developing the photoresist 201 on the base substrate using a mask 202 having a light-transmitting portion 202a, a partial-light-transmitting portion 202c and a light-blocking portion 202b to obtain a photoresist pattern having a photoresist-completely-removed region 20a, a photoresist-partially-removed region 201c and a photoresist-completely-retained region 201b, where the light-blocking portion 202b corresponds to a region where the bias electrode 42a, the photodiode and the transparent electrode 41 are to be formed, the partial-light-transmitting portion 202c correspond to a region where the bias electrode pin 42b is to be formed, and the mask 202 used in the step is gray-tone or half-tone mask (FIG. 21A illustrates a cross-sectional view taken along the line B-B' FIG. 21C of the sensing element during step S2; FIG. 21B illustrates a cross-sectional view taken along the line D-D' of FIG. 21C of the sensing element during step S2; and FIG. 21C illustrates a top view of the sensing element after S2).

Figure 22A:
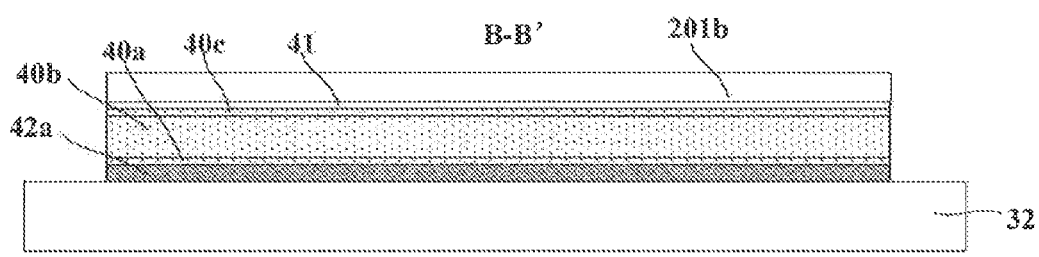
Figure 22B:
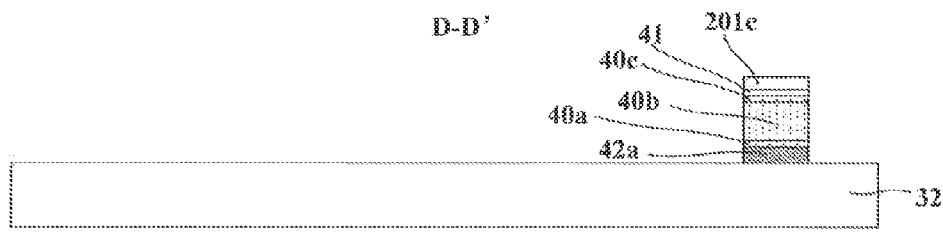
Figure 22C:
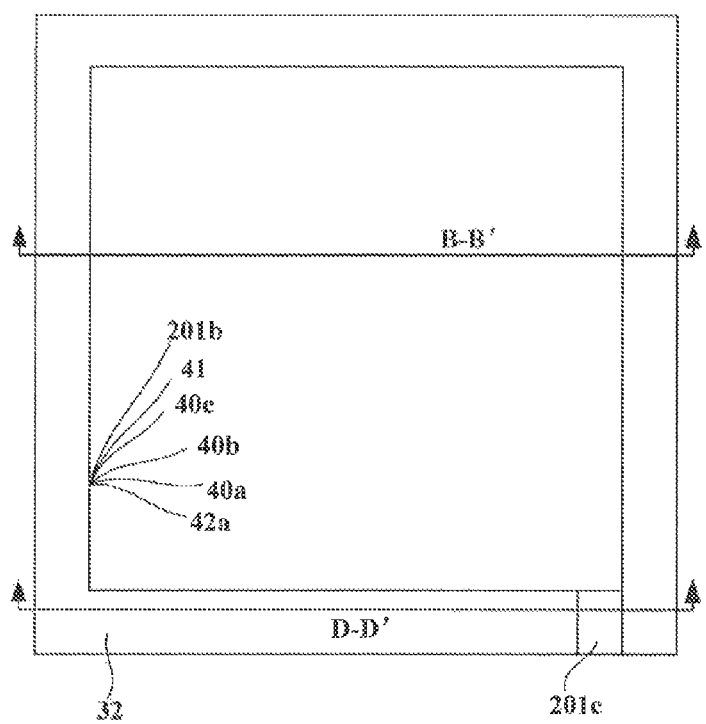

S3: etching the photoresist-completely-removed region on the base substrate to form the pattern of the bias electrode 42a, the pattern of the photodiode 40 and the pattern of the transparent electrode 41 (FIG. 22A illustrates a cross-sectional view taken along the line B-B' of FIG. 22C of the sensing element after step S3; FIG. 22B illustrates a cross-sectional view taken along the line D-D' of FIG. 22C of the sensing element after step S3; and FIG. 22C illustrates a top view of the sensing element after step S3).

Figure 23A:
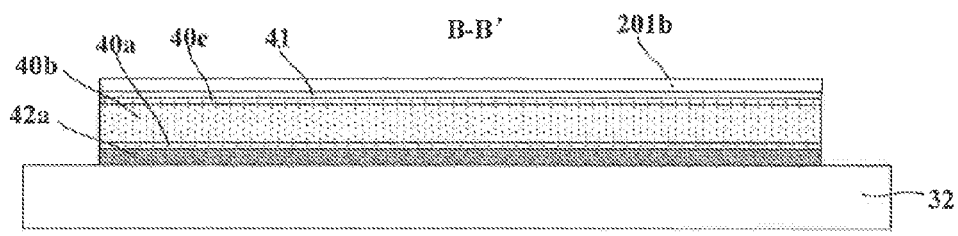
Figure 23B:
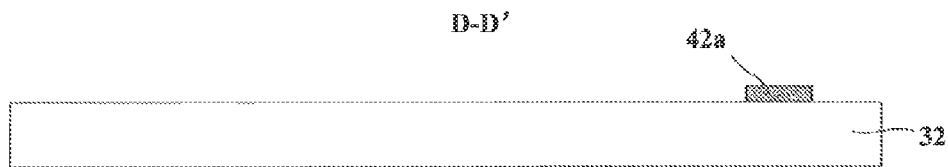
Figure 23C:
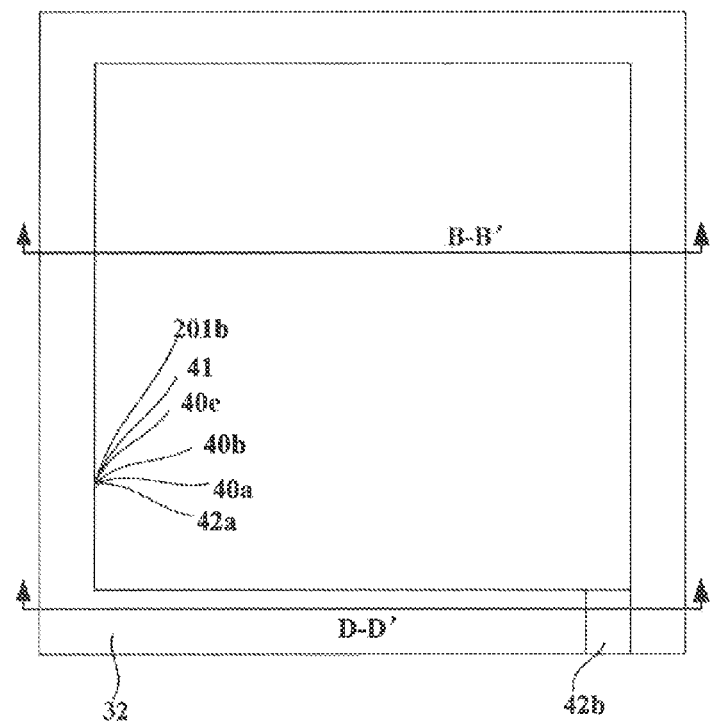

S4: ashing the photoresist-partially-removed region on the base substrate to remove the photoresist 201c in the photoresist-partially-removed region and retain the photoresist 202b in the photoresist-completely-retained region, and then etching and removing the photoresist to form the pattern of the bias electrode pin 42b (FIG. 23A illustrates a cross-sectional view taken along the line B-B' of FIG. 23C of the sensing element after step S4; FIG. 23B illustrates a cross-sectional view taken along the line D-D' of FIG. 23C of the sensing element after step S4; and FIG. 23C illustrates a top view of the sensing element after step S4).

When the photodiode is a PIN photodiode, the step of depositing the photodiode material layers at step Si may comprise steps of sequentially depositing an N-type semiconductor layer (n+a-Si), an I-type semiconductor layer (a-Si) and a P-type semiconductor layer (p+a-Si). More specifically, the N-type semiconductor is deposited on the bias electrode metal, the I-type semiconductor is deposited on the N-type semiconductor and the P-type semiconductor is deposited on the I-type semiconductor.

In the above description, positive photoresist is used as the example, in which the light-transmitting portion, the partial-light-transmitting portion and the light-blocking portion are used to expose the photoresist completely, partially and not at all respectively, and the photoresist is developed to obtain the photoresist-completely-removed region, photoresist-partially-removed region and photoresist-completely-retained region. The photoresist in the photoresist-completely-retained region is substantially completely retained.

In the embodiment of the invention, steps 103 and 107 are optional since the invention may be implemented even if the two steps are omitted. Thus, in an embodiment, a method for fabricating the sensor may only include the above steps 101, 102, 104 to 106.

In comparison with the conventional technology, the method for fabricating the sensor of the invention employs six or seven patterning processes, which reduces the number of mask as well as the production cost and simplifies the production process, thereby significantly improves the production capacity and the defect-free rate.

What are described above is related to the illustrative embodiments of the disclosure only and not limitative to the scope of the disclosure; the scopes of the disclosure are defined by the accompanying claims.

What is claimed is:
1. A sensor, comprising: a base substrate, a group of gate lines and a group of data lines arranged as crossing each other, and a plurality of sensing elements arranged in an array and defined by the group of gate lines and the group of data lines, each sensing element comprising a TFT device and a photodiode sensing device, wherein:
the TFT device comprises: a source electrode and a drain electrode arranged opposed to each other to form a channel, wherein the drain electrode is connected with a neighboring data line; an ohmic layer disposed on the source electrode and the drain electrode; an active layer disposed on the ohmic layer and overlaying the channel; a gate insulating layer disposed on the active layer; and a gate electrode disposed on the gate insulating layer and over the channel and connected with a neighboring gate line; and
the photodiode sensing device comprises: a bias electrode and a bias electrode pin disposed on the base substrate, the bias electrode pin is connected with the bias electrode; a photodiode disposed on the bias electrode; and a transparent electrode disposed on the photodiode, wherein the transparent electrode directly contacts with the photodiode and is electrically connected with the source electrode via a through hole.

2. The sensor of claim 1, further comprising:
a first passivation layer disposed on the transparent electrode and the bias electrode pin of each photodiode sensing device and overlaying the base substrate, wherein the source electrode, the drain electrode and the data line are disposed on the first passivation layer.

3. The sensor of claim 2, wherein the first passivation layer has a groove for accommodating the source electrode, the drain electrode, the data line and the ohmic layer, and has the through hole for connecting the source electrode and the transparent electrode.

4. The sensor of claim 3, further comprising: a second passivation layer disposed on the gate line and the gate electrode of each of the TFT devices and overlaying the base substrate.

5. The sensor of claim 1, wherein the photodiode is a PIN photodiode comprising: an N-type semiconductor disposed on the bias electrode, an I-type semiconductor disposed on the N-type semiconductor, and a P-type semiconductor disposed on the I-type semiconductor.

6. The sensor of claim 1, wherein the ohmic layer overlays both the source electrode and the drain electrode.

7. The sensor of claim 1, wherein the active layer overlays both the ohmic layer and the channel.

8. The sensor of claim 1, wherein the bias electrode pin overlaps the gate lines.

9. A method for fabricating a sensor comprising:
forming, on a base substrate, a pattern of a bias electrode, a pattern of a bias electrode pin connected with the bias electrode, a pattern of a photodiode disposed on the bias electrode and a pattern of a transparent electrode disposed on the photodiode;
forming a pattern of a source electrode, a drain electrode and a data line, as well as a pattern of an ohmic layer on the source electrode and the drain electrode, by using a patterning process, wherein the source electrode and the drain electrode are disposed opposed to each other to form a channel, the drain electrode is connected with the data line and the source electrode is electrically connected with the transparent electrode via a through hole with the transparent electrode directly contacting with the photodiode;
forming a pattern of an active layer which is disposed on the ohmic layer and overlays the channel by using a patterning process; and
forming a gate insulating layer overlaying the base substrate, and forming a pattern of a gate electrode which is disposed on the gate insulating layer and over the channel, and a pattern of a gate line connected with the gate electrode by using a patterning process.

10. The method of claim 9, further comprising the following step after the step of forming the pattern of the photodiode and the pattern of the transparent electrode and before the step of forming the pattern of the source electrode, the drain electrode and the data line and the pattern of the ohmic layer:
forming a pattern of a first passivation layer which is disposed on the transparent electrode and the bias electrode pin and overlays the base substrate by using a patterning process, wherein the first passivation layer has a groove for accommodating the source electrode, the drain electrode, the data line and the ohmic layer, and has the through hole for connecting the source electrode and the transparent electrode.

11. The method of claim 9, further comprising the following step after forming the pattern of the gate electrode and the pattern of the gate line:
forming a pattern of a second passivation layer overlaying the base substrate by using a patterning process.

12. The method of claim 9, wherein the pattern of the transparent electrode is formed via wet etching, or, the pattern of the transparent electrode is formed at the same time with the pattern of the photodiode via dry etching.

13. The method of claim 9, wherein the formation of a pattern of the bias electrode, a pattern of the bias electrode pin, a pattern of the photodiode and a pattern of the transparent electrode is achieved which comprises:
sequentially depositing, on the base substrate, the bias electrode metal, the photodiode material layer and the transparent electrode layer, and applying a photoresist on the transparent electrode layer;
exposing and developing the photoresist on the base substrate using a mask having a light-transmitting portion, a partial-light-transmitting portion and a light-blocking portion to obtain a photoresist pattern having a photoresist-completely-removed region, a photoresist-partially-removed region and a photoresist-completely-retained region, wherein the light-blocking portion corresponds to a region where the bias electrode, the photodiode and the transparent electrode are to be formed, the partial-light-transmitting portion corresponds to a region where the bias electrode pin is to be formed;
etching the photoresist-completely-removed region on the base substrate to form the pattern of the bias electrode, the pattern of the photodiode and the pattern of the transparent electrode;
ashing the photoresist-partially-removed region on the base substrate to remove the photoresist in the photoresist-partially-removed region and retain the photoresist in the photoresist-completely-retained region, and then etching and removing the photoresist to form the pattern of the bias electrode pin.

14. The method of claim 9, wherein the formation of a pattern of the bias electrode, a pattern of the bias electrode pin, a pattern of the photodiode and a pattern of the transparent electrode is achieved by using two patterning processes, which comprise:
forming, on the base substrate, a pattern of the bias electrode and a pattern of the bias electrode pin connected with the bias electrode by using a patterning process;
forming a pattern of the photodiode on the bias electrode and a pattern of the transparent electrode on the photodiode by using a patterning process.

15. The method of claim 14, wherein the photodiode is a PIN photodiode, and the step of forming the pattern of the photodiode and the pattern of the transparent electrode by using a single patterning process comprises:
sequentially depositing an N-type semiconductor layer, an I-type semiconductor layer and a P-type semiconductor layer, and forming the pattern of the photodiode and the pattern of the transparent electrode by using the single patterning process.

16. A method for fabricating a sensor comprising:
forming, on a base substrate, a pattern of a bias electrode, a pattern of a bias electrode pin connected with the bias electrode, a pattern of a photodiode disposed on the bias electrode and a pattern of a transparent electrode disposed on the photodiode;
forming a pattern of a source electrode, a drain electrode and a data line, as well as a pattern of an ohmic layer on the source electrode and the drain electrode, by using a patterning process, wherein the source electrode and the drain electrode are disposed opposed to each other to form a channel, the drain electrode is connected with the data line and the source electrode is connected with the transparent electrode;

forming a pattern of an active layer which is disposed on the ohmic layer and overlays the channel by using a patterning process; and forming a gate insulating layer overlaying the base substrate, and forming a pattern of a gate electrode which is disposed on the gate insulating layer and over the channel, and a pattern of a gate line connected with the gate electrode by using a patterning process;

wherein the formation of a pattern of the bias electrode, a pattern of the bias electrode pin, a pattern of the photodiode and a pattern of the transparent electrode is achieved, which comprises:

sequentially depositing, on the base substrate, the bias electrode metal, the photodiode material layer and the transparent electrode layer, and applying a photoresist on the transparent electrode layer;

exposing and developing the photoresist on the base substrate using a mask having a light-transmitting portion, a partial-light-transmitting portion and a light-blocking portion to obtain a photoresist pattern having a photoresist-completely-removed region, a photoresist-partially-removed region and a photoresist-completely- retained region, wherein the light-blocking portion corresponds to a region where the bias electrode, the photodiode and the transparent electrode are to be formed, the partial-light-transmitting portion correspond to a region where the bias electrode pin is to be formed;

etching the photoresist-completely-removed region on the base substrate to form the pattern of the bias electrode, the pattern of the photodiode and the pattern of the transparent electrode;

ashing the photoresist-partially-removed region on the base substrate to remove the photoresist in the photoresist-partially-removed region and retain the photoresist in the photoresist-completely-retained region, and then etching and removing the photoresist to form the pattern of the bias electrode pin.

17. The method of claim 16, further comprising the following step after the step of forming the pattern of the photodiode and the pattern of the transparent electrode and before the step of forming the pattern of the source electrode, the drain electrode and the data line and the pattern of the ohmic layer:

forming a pattern of a first passivation layer which is disposed on the transparent electrode and the bias electrode pin and overlays the base substrate by using a patterning process, wherein the first passivation layer has a groove for accommodating the source electrode, the drain electrode, the data line and the ohmic layer, and has a through hole for connecting the source electrode and the transparent electrode.

18. The method of claim 16, further comprising the following step after forming the pattern of the gate electrode and the pattern of the gate line:

forming a pattern of a second passivation layer overlaying the base substrate by using a patterning process.

19. The method of claim 16, wherein the pattern of the transparent electrode is formed via wet etching, or, the pattern of the transparent electrode is formed at the same time with the pattern of the photodiode via dry etching.

20. The method of claim 17, further comprising the following step after forming the pattern of the gate electrode and the pattern of the gate line:

forming a pattern of a second passivation layer overlaying the base substrate by using a patterning process.

\* \* \* \* \*